United States Patent [19]
Ueda

[11] Patent Number: 5,138,370
[45] Date of Patent: Aug. 11, 1992

[54] METHOD AND APPARATUS FOR RECORDING IMAGES USING DIFFUSED LIGHT

[75] Inventor: Masashi Ueda, Nagoya, Japan

[73] Assignee: Brother Kogyo Kabushiki Kaisha, Nagoya, Japan

[21] Appl. No.: 495,773

[22] Filed: Mar. 19, 1990

[30] Foreign Application Priority Data

Apr. 18, 1989 [JP]  Japan .................................. 1-98381

[51] Int. Cl.$^5$ .............................................. G03B 27/72
[52] U.S. Cl. ......................................... 355/71; 355/70
[58] Field of Search ................... 355/27, 71, 67, 70

[56] References Cited

U.S. PATENT DOCUMENTS

| | | | |
|---|---|---|---|
| 3,586,849 | 6/1971 | Starkweather et al. | 355/70 X |
| 3,669,538 | 6/1972 | Fowler | 355/67 |
| 3,697,177 | 10/1972 | Booth | 355/67 |
| 3,777,135 | 12/1973 | Rees | 355/70 |
| 4,250,538 | 2/1981 | Durbin et al. | 355/67 X |
| 4,259,711 | 3/1981 | Mochizuki | 355/67 X |
| 4,333,130 | 6/1982 | Mochizuki et al. | 355/67 X |
| 4,399,209 | 8/1983 | Sanders et al. | 430/138 |
| 4,440,846 | 4/1984 | Sanders et al. | 430/138 |
| 4,912,505 | 3/1990 | Larson | 355/71 X |

*Primary Examiner*—Richard A. Wintercorn
*Attorney, Agent, or Firm*—Oliff & Berridge

[57] ABSTRACT

An image recording apparatus for recording the image information of a document on the surface of a photosensitive recording medium by irradiating the surface of the document and exposing the surface of the photosensitive recording medium to light reflected from the document is disclosed. A white, translucent film for diffusing light is applied to the upper surface of a contact glass, on which the document is placed, to irradiate the surface of the photosensitive recording medium by both diffused light reflected from the surface of the document and carrying image information, and white light reflected from the surface of the white, translucent film and not carrying any image information. The image recording apparatus records the image information of an image having satisfactory gradation and high definition and not having any pseudocontour.

18 Claims, 3 Drawing Sheets

METHOD AND APPARATUS FOR RECORDING IMAGES USING DIFFUSED LIGHT

BACKGROUND OF THE INVENTION

1. Field of the Invention

The present invention relates to an image recording apparatus and, more specifically, to an image recording apparatus capable of exposing the surface of a photosensitive recording medium to reflected light from a document to record the information of the document on the surface of the photosensitive recording medium.

2. Description of Related Art

Methods of recording the image information of a document on the surface of a photosensitive recording medium by exposing the surface of the photosensitive recording medium to reflected light from the illuminated document have been disclosed in, for example, U.S. Pat. Nos. 4,399,209 and 4,440,846.

The photosensitive characteristic of such a photosensitive recording medium, in general, has a nonsensitive region in which the exposure density is not increased when the exposure is below a predetermined level, a sensitive region where the exposure density is proportional to the amount of exposure and a saturation region in which the exposure density is saturated on a fixed level when the exposure is above a predetermined level as shown in FIG. 1. When the exposure is in the nonsensitive region, the gradation of an image formed on the surface of the photosensitive recording medium is unsatisfactory. A method of improving the gradation by additional exposure, i.e., auxiliary exposure, is disclosed in U.S. patent application Ser. No. 20956 (Filing date: Mar. 2, 1987) now abandoned in favor of U.S. patent application Ser. No. 4,935,749. This method and system of auxiliary exposure, however, requires an additional auxiliary exposure device. Japanese Patent Laid-open No. 63-291048 discloses a method employing a dot screen to improve gradation. However, an image formed of dots is unsatisfactory in definition.

On the other hand, it is generally known that reflected light reflected from a document by specular reflection (glare) does not carry any image information. In particular, when the original has, for example, a glossy finish, light supplied by the light source does not enter the material which contains the image but is instead reflected by the glossy finish. This specular reflection, or glare, does not contain any image information. Accordingly, the luminous intensity of the light source must be increased, which requires a high-tension power source and increases power consumption.

Furthermore, the aforesaid photosensitive characteristic of the photosensitive recording medium forms unavoidable pseudocontours on the boundaries between the nonsensitive region and the sensitive region and between the sensitive region and the saturation region. These pseudocontours appear to be, for example, the end or boundary of an object in the image, but in reality are merely boundaries between portions of the recording medium which have been exposed to adequate and either too little or too much light.

SUMMARY OF THE INVENTION

It is a first object of the present invention to provide an image recording apparatus capable of recording an image having satisfactory gradation and high definition without increasing production costs.

It is a second object of the present invention to provide an image recording apparatus capable of recording an image having no pseudocontours.

It is a third object of the present invention to provide an image recording apparatus capable of recording an image having satisfactory gradation and high definition at a reduced amount of power consumption.

It is a fourth object of the present invention to provide an image recording apparatus capable of recording an image having no pseudocontours at a low amount of power consumption.

BRIEF DESCRIPTION OF THE DRAWINGS

The invention will be described in detail with reference to the accompanying drawings in which.

DETAILED DESCRIPTION OF THE PREFERRED EMBODIMENT

Figure 1:
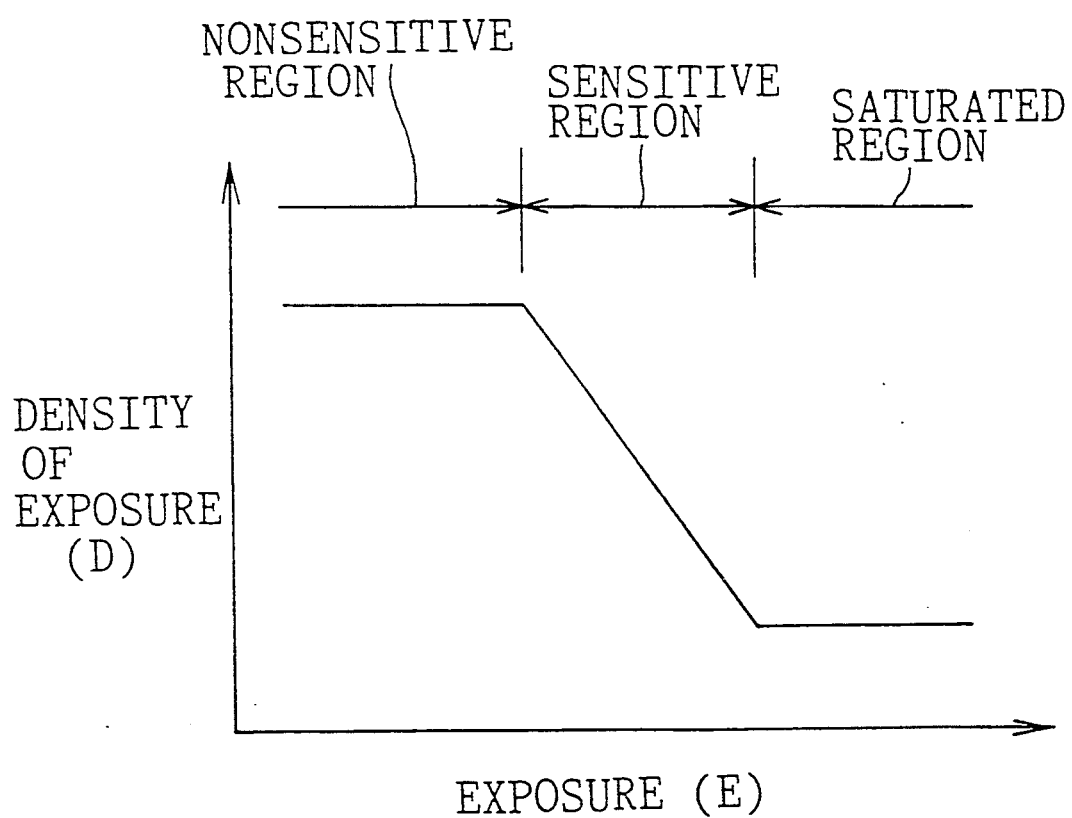
FIG. 1 is a graph illustrating the photosensitive characteristic of a photosensitive recording medium embodying the present invention.
Figure 2:
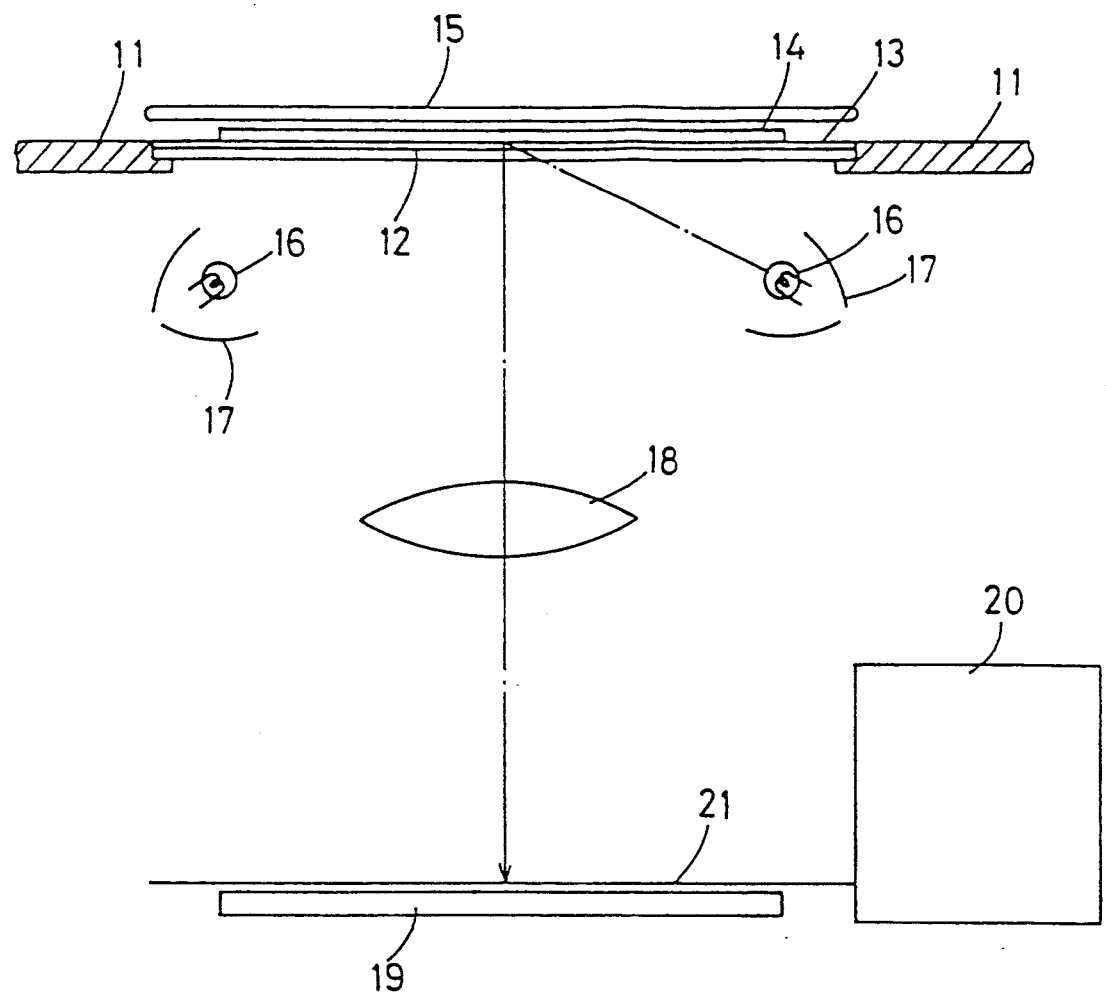
FIG. 2 is a schematic view of an exposure unit employed in an image recording apparatus embodying the present invention.

A preferred embodiment of an image recording apparatus according to the present invention will be described hereinafter with reference to the accompanying drawings. FIG. 2 shows an image recording apparatus which includes contact glass 12 for supporting a document 14. The contact glass 12 is attached to the upper surface of a casing 11. A white, translucent film 13 is applied to the upper surface of the contact glass 12. The white, translucent film 13 is formed by spreading a solution of a transparent resin, such as polyethylene terephthalate, containing a white dye and has a thickness of 50 $\mu$m and a transmissivity in the range of 80 to 90% (i.e., a reflectance in the range of 10 to 20%). A document cover 15 is provided on the contact glass 12 to cover the document 14. It is desirable that the document 14 is held in close contact with the white, translucent film 13 when covered with the cover 15.

A pair of halogen lamps 16, i.e., light sources, are disposed below the opposite sides of the contact glass 12. A reflector 17 is disposed behind each halogen lamp 16 to reflect the light emitted by the halogen lamps 16 so that the document 14 placed on the contact glass 12 is illuminated efficiently and uniformly by the halogen lamps 16.

A focusing lens 18 is disposed under the central portion of the contact glass 12. An exposure platen 19 is disposed exactly on the focal plane of the focusing lens 18. The focusing lens 18 focuses the light reflected from the document 14 on a photosensitive recording medium 21, such as a photosensitive pressure-sensitive sheet, fed from a cartridge 20 onto the exposure platen 19.

Figure 3:
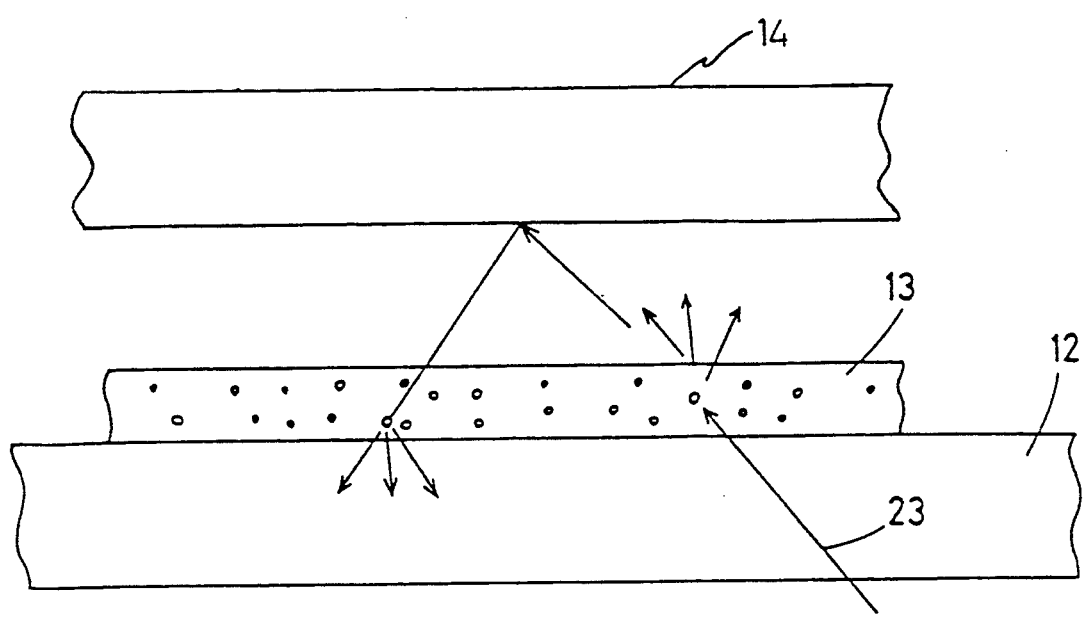
FIG. 3 is an enlarged view illustrating the function of an essential portion of the exposure unit shown in FIG. 2.

In operation, the light emitted by the halogen lamps 16 is reflected efficiently by the reflectors 17 toward the contact glass 12. The light is transmitted through the contact glass 12 and is diffused in all directions by the white, translucent film 13 to illuminate the document 14 by the diffused light as illustrated in FIG. 3. Most portions of light 23 transmitted through the contact glass 12 is diffused in all directions by the white, translucent film 13 and falls in all directions on the document 14. Light reflected by the document 14 and diffused again by the white, translucent film 13 is focused by the focusing lens 18 on the surface of the photosensitive recording medium 21. Slight diffusion of the reflected light reflected by the document 14 by the white, translucent film 13 blurs the image formed on the photosensitive recording medium 21. It has been proved empirically that the degree of blurriness of the image is tolerable when the document 14 is placed close to or in close contact with the white, translucent film 13. On the other hand, the diffusing function of the white, translucent film 13 reduces the quantity of light reflected by specular reflection and increases the quantity of effective reflected light carrying image information even if the surface of the document 14 is highly specular. Some of the light emitted by the halogen lamps 16 is reflected partially by the lower surface of the white, translucent film 13. The white reflected light reflected by the lower surface of the white, translucent film 13 does not carry any image information and is transmitted through the lens 18 to simply irradiate the surface of the photosensitive recording medium 21 for auxiliary exposure. Thus, the reflected light carrying image information and the reflected white light not carrying any image information form cooperatively an image having satisfactory gradation and high definition on the photosensitive recording medium 21 and reduce pseudocontours attributable to the non-linear photosensitive characteristic of the photosensitive recording medium.

The white, translucent film 13 is employed for diffusing the light on the contact glass 12 to obviate the adverse influence of the reflected light not carrying any image information and used for auxiliary exposure on a color image formed on the surface of the photosensitive recording medium. It is obvious that auxiliary exposure by the white reflected light reflected by the white, translucent film 13 and not carrying any image information does not affect the color balance of a color image at all.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description. All changes which come within the meaning and range of equivalency of the claims are therefore intended to be embraced therein. For instance, although the photosensitive recording medium referred to in the description of the preferred embodiment is a color microcapsule sheet disclosed in U.S. Pat. No. 4,399,209, any suitable photosensitive recording medium may be used on the image recording apparatus of the present invention. The present invention is applicable to an image recording apparatus of a moving light source type as well as to an image recording apparatus of a moving contact plate type.

What is claimed is:

1. An image recording apparatus comprising:
   supporting means for supporting a document;
   a light source for irradiating a document placed on said supporting means;
   exposure means for receiving a photosensitive recording medium and light reflected from a surface of the document placed on said supporting means; and
   light diffusing means, including a translucent member located between said light source and the document placed on said supporting means, for diffusing light emitted by said light source, at least some of said diffused light reaching the document placed on said supporting means.

2. The image recording apparatus according to claim 1, wherein said translucent member also reflects some of the light emitted by said light source to said exposure means without being reflected by a surface of the document.

3. The image recording apparatus according to claim 2, wherein the light reflected by said translucent member is reflected by a lower surface of said translucent member.

4. An image recording apparatus comprising:
   supporting means for supporting a document;
   a light source for irradiating a document placed on said supporting means;
   exposure means for receiving a photosensitive recording medium and light reflected from a surface of the document placed on said supporting means; and
   a translucent member, upon which the document is placed, for diffusing light emitted by said light source prior to reaching the document.

5. The image recording apparatus according to claim 4, wherein said translucent member has a transmissivity in the range of 80 to 90%.

6. The image recording apparatus according to claim 4, wherein said translucent member is a white translucent member.

7. The image recording apparatus according to claim 1, wherein said supporting means is a plate of glass.

8. An image recording apparatus according to claim 7, wherein said translucent member is provided above said plate of glass.

9. An image recording apparatus according to claim 8, wherein said translucent member is located on said plate of glass so that a document is placed in close contact with said translucent member while being recorded.

10. The image recording apparatus according to claim 7, wherein said translucent member is located on a first side of said plate of glass.

11. An image recording apparatus comprising:
    a plate of glass for supporting a document;
    a light source for irradiating a document placed on said plate of glass;
    exposure means for receiving a photosensitive recording medium and light reflected from a surface of the document placed on said plate of glass; and
    light diffusing means for diffusing light emitted by said light source prior to reaching the document placed on said plate of glass, said light diffusing means being located on a first side of said plate of glass, and said light source being located on a side of said plate of glass opposite from said first side.

12. The image forming apparatus according to claim 18, wherein said translucent member is a translucent film.

13. The image recording apparatus according to claim 12, wherein said translucent film is a white translucent film.

14. The image recording apparatus according to claim 12, wherein said translucent film is formed by spreading a solution of a transparent resin containing a white dye on a surface of said plate of glass.

15. The image recording apparatus according to claim 13, wherein said translucent film has a transmissivity in the range of 80 to 90%.

16. The image recording apparatus according to claim 11, wherein said light diffusing means is operatively associated with said supporting means so that a document is placed close to said light diffusing means while being recorded.

17. The image recording apparatus according to claim 11, wherein said light diffusing means is operatively associated with said supporting means so that a document is placed in close contact with said light diffusing means while being recorded.

18. An image recording apparatus comprising:
a contact glass for supporting a document;
a light source disposed below said contact glass for irradiating a document placed on said contact glass;
exposure means for receiving a photosensitive recording medium and light reflected from a surface of a document placed on said supporting means; and
light diffusing means for diffusing light emitted by said light source toward a surface of a document placed on said contact glass, said light diffusing means comprising a layer of white translucent material located on an upper surface of said contact glass.

* * * * *